United States Patent
Lee et al.

(10) Patent No.: US 6,335,629 B1
(45) Date of Patent: Jan. 1, 2002

(54) TEST FIXTURE HAVING AN OPENING FOR EXPOSING THE BACK OF A SEMICONDUCTOR CHIP AND TESTING MODULE COMPRISING THE SAME

(75) Inventors: Sang Sik Lee, Yongin; Kye Won Ha, Suwon; Jong Wook Kim, Yongin; Chung Koo Yoon, Seoul, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/115,910

(22) Filed: Jul. 15, 1998

(30) Foreign Application Priority Data

Aug. 12, 1997 (KR) .................................................. 97-38465

(51) Int. Cl.⁷ .......................... G01R 31/02; G01R 31/303
(52) U.S. Cl. ............................ 324/755; 324/752; 324/765
(58) Field of Search .................................... 324/755, 765, 324/754, 751, 752, 158.1

(56) References Cited

U.S. PATENT DOCUMENTS

| | | | | |
|---|---|---|---|---|
| 3,391,383 A | * | 7/1968 | Antes ........................... | 324/158.1 |
| 4,312,117 A | * | 1/1982 | Robillard et al. ............. | 438/107 |
| 5,583,445 A | * | 12/1996 | Mullen .......................... | 324/754 |
| 5,838,159 A | * | 11/1998 | Johnson ........................ | 324/754 |
| 5,926,027 A | * | 7/1999 | Bumb, Jr. et al. ............ | 324/765 |
| 6,020,745 A | * | 2/2000 | Jeng .............................. | 324/755 |

OTHER PUBLICATIONS

N.M. Wu et al., "Failure Analysis From Back Side of Die", Proceedings of the 22nd International Symposium for Testing and Failure Analysis, Nov. 18–22, 1996, Los Angeles, California, pp. 393–399.

Jeong–Seon Seo et al., "Intelligent Defect Localization Methodology through the use of Photoemission Spectral Analysis" pp. 22–27, Prior to Aug. 12, 1997.

T. Ishii et al., "Functional Failure Analysis Technology from Backside of VLSI Chip" Proceedings of the 20th International Symposium for Testing and Failure Analysis, Nov. 13–18, 1994, pp. 41–47.

\* cited by examiner

*Primary Examiner*—Ernest Karlsen
(74) *Attorney, Agent, or Firm*—Volentine Francos, PLLC

(57) ABSTRACT

A testing module for use in testing a semiconductor chip for failures in its integrated circuits includes a test fixture, and a decapsulated semiconductor device package mounted to the fixture. The semiconductor device package includes a semiconductor chip having an active front surface at which the integrated circuits are formed, a back which is opposed to the active front, a plurality of leads for electrically connecting the semiconductor chip to an external apparatus, and a package body having a backside which is decapsulated so as to expose the back of the semiconductor chip. The test fixture includes a fixture body having a loading surface contacting the front of the package body and supporting the semiconductor device package, a cover which has an opening through which the back of the semiconductor chip is exposed, and a plurality of projections contacting the leads of the semiconductor device package. The cover is connected to the fixture body but can be opened to allow the semiconductor device package to be inserted into and removed from the test fixture. The test fixture includes a plurality of connection pins having inner ends that are electrically connected to the leads of the semiconductor device package, and outer ends which protrude from the fixture body and are electrically connected to external testing apparatus.

22 Claims, 5 Drawing Sheets

TEST FIXTURE HAVING AN OPENING FOR EXPOSING THE BACK OF A SEMICONDUCTOR CHIP AND TESTING MODULE COMPRISING THE SAME

BACKGROUND OF THE INVENTION

1. Field of the Invention

The present invention generally relates to a test fixture for supporting a semiconductor device package while its semiconductor chip is being tested. More particularly, the present invention relates to a test fixture for electrically connecting a semiconductor chip of a semiconductor device package to a test board, and which fixture allows the backside of the chip to be analyzed while signals are supplied to the chip via the test board. The present invention also relates to a testing module comprising a decapsulated semiconductor device package mounted to a test fixture.

2. Description of the Related Art

Testing the quality of semiconductor integrated circuits usually includes a hot spot detection test. Hot spot detection tests can be carried out using any one of three techniques: Emission Microscopy (EMS), Liquid Crystal, and Optical Beam Induced Current (OBIC) techniques. Emission Microscopy is a technique of collecting photons from a semiconductor chip after providing a power supply voltage to the semiconductor chip. The collected photons are analyzed to uncover any defective component of the chip. Specifically, an emission microscope has a detector which detects infrared light emitted from the chip.

In some devices having a relatively complex circuit layout, an area of potential failure of the chip is located at the front of the chip but under the power bus lines. In a multi-layer metal device, an area of potential failure is also located nearest to the front of the chip but under multiple layers of metal lines. In a specialty package known as a flip chip, the front of the chip is in effect flipped over and thus cannot be exposed. Accordingly, the front of such chips cannot be analyzed for defects using a conventional hot spot detection technique.

Recently, LOC (Lead-On-Chip) packages have been widely used in memory devices. However, the active front surface of the chip of a LOC is blocked by the leads of a lead frame of the package. Accordingly, these packages also can not be analyzed for failures from the front of the chip.

Therefore, tests from the back of a chip have been developed to detect the location and cause of semiconductor package device failures. Such backside failure analysis is disclosed in T. Ishii and K. Miyamoto, "Functional Failure Analysis Technology from Backside of VLSI Chip", Proceedings of the 20th International Symposium for Testing and Failure Analysis (ISFTA), 1994, pp. 41–47; N. M. Wu et. al., "Failure Analysis from Back Side of Die", ISTFA, 1996, pp. 393–399; and Jeong-Seon Seo et. al, "Intelligent Defect Localization Methodology Through the Use of Photoemission Spectral Analysis", ISTFA, 1995, pp. 22–27.

The first important step in conducting backside analysis is backside decapsulation. For a flip chip, backside decapsulation is not problematic. However, for a regularly packaged chip, backside decapsulation is relatively difficult because the die pad and the adhesive attaching the chip to the die pad need to be removed. In addition, the back of the chip needs to be ground and polished to make the chip thinner.

The backside decapsulation process may be summarized as follows. First, a portion of the package is removed so that the die pad is exposed. The die pad is removed, and then the adhesive attached to the back of the chip is washed away with acetone. Then, the back of the chip is ground to make the chip thinner, and is polished to remove scratches having a size of at least 1 $\mu$m. After that, the back of the chip is washed and cleaned.

A wet-etching method using an etchant such as $N_2$ or $H_2SO_4$, or a drill or a milling machine may be used to decapsulate the back of the package. The backside decapsulation process involving the use of a drill or milling machine is carried out as follows. First, the back of the package is ground away by a milling machine or a hand drill until the die pad is exposed. The area removed from the back of the package thus needs to be as large as that of the die pad. A metal such as silver (Ag), which is attached between the die pad and the back of the semiconductor chip for improving the electrical conductivity, is removed by a blade or by tweezers. The adhesive attaching the semiconductor chip to the die pad is then easily removed with a cotton-tipped swab saturated with acetone. After that, the back of the semiconductor chip is ground by a diamond-headed tip to reduce the thickness of the chip.

To conduct a backside failure analysis using the hot spot detection technique, the decapsulated semiconductor device package must be mounted on a test board, which is connected to a test apparatus. The test board has wiring patterns, which are electrically connected to the outer leads of the semiconductor device package. However, if a semiconductor device package having a decapsulated backside is mounted on a test board with the back of the package facing the wiring patterns at the upper surface of the test board, the decapsulated backside of the semiconductor device package would not be exposed in a manner which would allow for a backside failure analysis to be performed.

SUMMARY OF THE INVENTION

Therefore, an object of the present invention is to provide a test fixture which will support a semiconductor device package having a decapsulated backside in a manner which allows a backside failure analysis of the semiconductor chip of the package to be performed.

Another object of the present invention is to provide a testing module which, when connected to a test board, allows a decapsulated semiconductor device package thereof to undergo backside failure analysis while power is supplied via the test board to a chip of the package.

In the testing module of the present invention, the semiconductor device package includes a semiconductor chip having an active front at which integrated circuits are formed, a back, a package body, and a plurality of leads for electrically connecting the semiconductor chip to an external apparatus. The package body of the semiconductor device package has a backside, which is partially decapsulated so as to expose the back of the semiconductor chip, and a front which is opposed to the back side.

The test fixture of the present invention includes a fixture body, a cover, and a plurality of connection pins. The fixture body has a loading surface which contacts the front of the package body and supports the package. The cover has an opening for exposing the back of the semiconductor chip, and a plurality of projections for contacting the leads of the semiconductor device package. The connection pins have inner ends which are electrically connected to the leads of the semiconductor device package, and outer ends integral with the inner ends. The outer ends of the connection pins protrude from the fixture body and are electrically connected to external apparatus.

Further, the inner ends of the connection pins comprise buffer parts. The buffer parts prevent the leads of the semiconductor device package from being damaged, and reduce the contact resistance between the leads and the connection pins.

The projections of the cover and the inner ends of the connection pins may be configured appropriately for the test fixture of the present invention to be suitable for use with various types of packages, such as SOJs (Small Outline J-leaded), QFPs (Quad Flat Package), SOPs (Small Outline Package), PLCCs (Plastic Leaded Chip Carrier), and DIPs (Dual Inline Package).

BRIEF DESCRIPTION OF THE DRAWINGS

These and various other objects, features and advantages of the present invention will be described with reference to the accompanying drawings, wherein like reference numerals designate like structural elements, and, in which.

DETAILED DESCRIPTION OF THE PREFERRED EMBODIMENTS

Preferred embodiments of the present invention will be described below with reference to the accompanying drawings.

Figure 1:
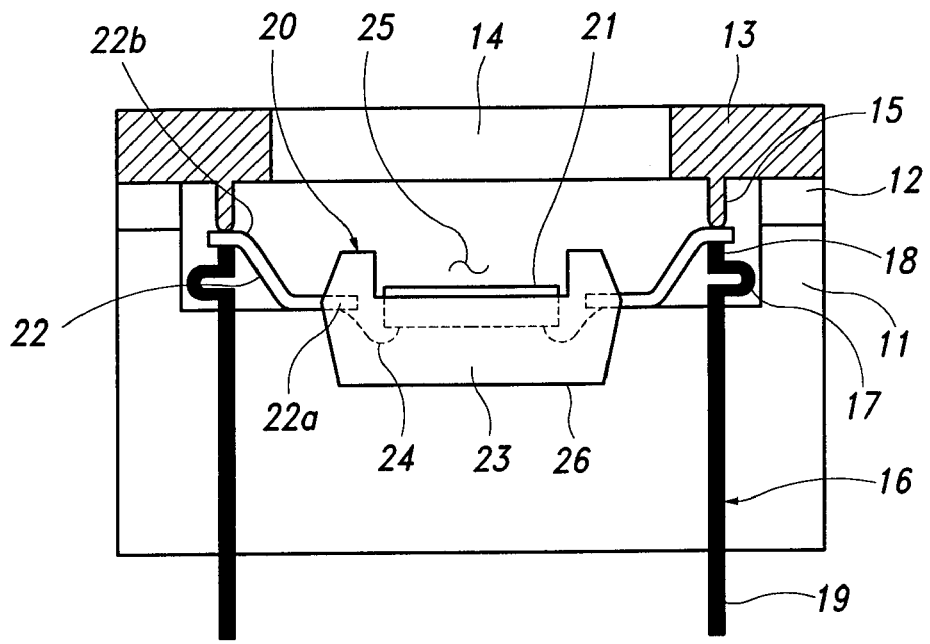
FIG. 1 is a cross-sectional view of an embodiment of a testing module according to the present invention.
Figure 2:
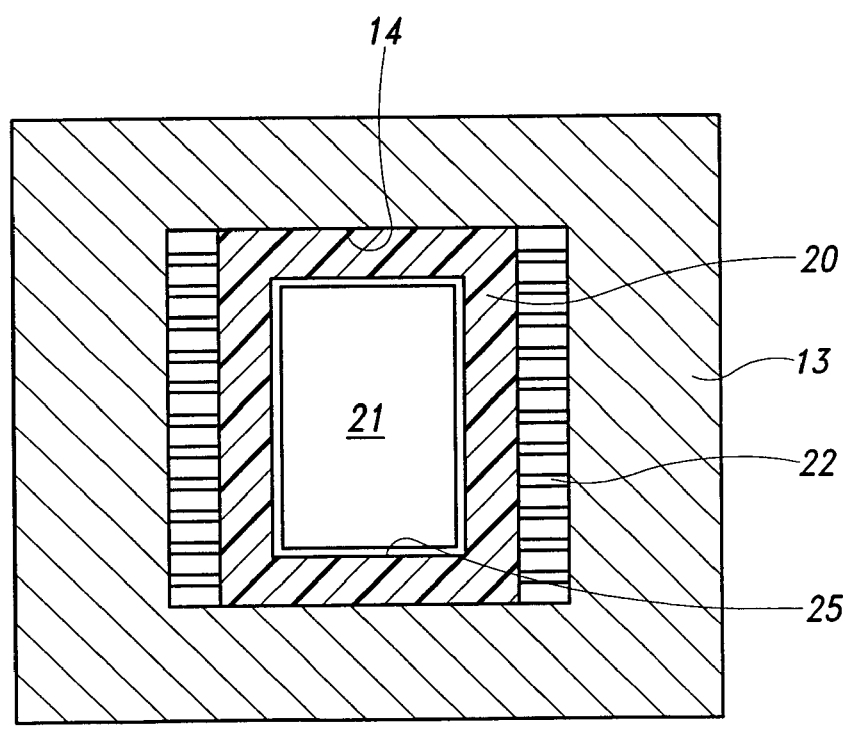
FIG. 2 is a plan view of the testing module of FIG. 1.

Referring first to FIG. 1 and FIG. 2, a test fixture of the present invention comprises a fixture body 11, a connecting part 12, a cover 13 and connection pins 16. The cover 13 is connected to the fixture body 11 at a connecting part 12. The cover 13 can be separated from the fixture body 11 at the connecting part 12 so that the semiconductor device package 20 can be inserted in the test fixture 10. An opening 14 is formed in the cover 13 to expose the back of a semiconductor chip 21 inserted in the test fixture. This opening will be referred to as the "cover opening 14". The cover 13 also has projections 15 whose function will be described later. Once the semiconductor device package is inserted in the test fixture, and the cover 13 is closed, a testing module of the present invention is provided.

The fixture body 11 has a loading surface 26, on which the semiconductor device 20 is to be supported, and through-holes through which the connection pins 16 extend. The loading surface 26 may incorporate a concave surface having a shape complementary to that of the semiconductor device package 20. The semiconductor device package 20 comprises the semiconductor chip 21, a plurality of leads 22, and a package body 23. The semiconductor chip 21 has an active front surface at which the integrated circuits are formed, and a back which is opposed to the active front surface. The semiconductor device package 20 is mounted to the test fixture so that the active front surface of the semiconductor chip 21 faces downwards. The leads 22 are electrically connected by bonding wires 24 to electrode pads (not shown) which are formed on the active surface of the chip 21. The leads 22 have inner portions 22a, and outer portions 22b integral with the inner portions 22a. The inner portions 22a of the leads 22 are electrically connected by the bonding wires 24 to the chip 21, and the chip 21 and inner portions 22a of the leads 22 are encapsulated by the package body 23. The outer portions 22b of the leads 22 protrude from the package body 23 and electrically connect the chip 21 to external circuit terminals such as the connection pins 16. The outer portions 22b of the leads 22 may protrude from two or four sides of the package body 23. The outer portions 22b of the leads 22 are also bent into certain shapes. As shown in FIG. 1, the outer portions 22b are bent into a gull wing shape, whereby the semiconductor device package is of the surface mounting type.

The backside of the semiconductor device package 20 has an opening 25 through which the back of the semiconductor chip 21 is exposed. This opening 25 is formed, for example, by decapsulating the back of the package body 23 using the above-described drilling or milling method. Other suitable decapsulating techniques may be used as well.

The connection pins 16 have inner ends 18 which contact the outer portions 22b of the leads 22 of the semiconductor device package 20, and outer ends 19 which protrude from the fixture body 11. The inner ends 18 also have resilient buffer (U-shaped) parts 17 which prevent the outer portions 22b of the leads 22 from being damaged, and reduce the contact resistance between the leads 22 and the pins 16 when the outer portions 22b of the leads 22 of the semiconductor device package 21 are engaged between the projections 15 of the cover 13 and the inner ends 18 of the pins 16. The outer ends 19 of the pins 16 are electrically connected to the wiring patterns of the test board.

When the outer ends 19 of the pins 16 are electrically connected to the wiring patterns of the test board, the pins 16 transfer signals between the semiconductor device package and the test apparatus connected to the test board. And, because the outer ends 19 of the pins 16 and the opening 14 are located at opposite ends of the test fixture from one another, heat or light may be detected from the back of the semiconductor chip (backside failure analysis) through the cover opening 14 while the test fixture is mounted to the test board.

The cover opening 14 needs to be larger than the opening 25 in the backside of the semiconductor device package 20. Furthermore, the fixture body 11, the connector 12, and the cover 13 are formed from an electrically insulative material. If the images of the circuit patterns are not properly obtained during the thermal analysis of the semiconductor chip, the fixture is heated approximately 30 to 80° C. Therefore, the fixture body 11 also needs to have excellent thermal conductivity.

The above-described test fixture is suitable for testing semiconductor device packages in which the outer leads are bent outward, such as SOPs (Small Outline Package), TSOPs (Thin SOP), or QFPs (Quad Flat Package). However, the test fixture of the present invention may be suitable for use with semiconductor device packages in which the outer leads are bent inward. For example, FIG. 3 shows a test fixture which is suitable for a semiconductor device package 40 having J-shaped outer leads 42b.

In this embodiment, the test fixture has a fixture body 31, and connection pins 36 having outer ends 39 which protrude from the fixture body 31 and inner ends 38 which are bent (L-shaped overall). The inner ends 38 of the connection pins 36 contact the J-shaped outer leads 42b of the semiconductor device package 40 when the testing module is set up, but do not extend so far as to cover the opening in the backside of the package. Projections 35 of a cover 33 of the test fixture contact the horizontal portions of the inner ends 38 of the pins 36. The back of a semiconductor chip 41 of the package is exposed to the outside through a cover opening 34.

Figure 3:
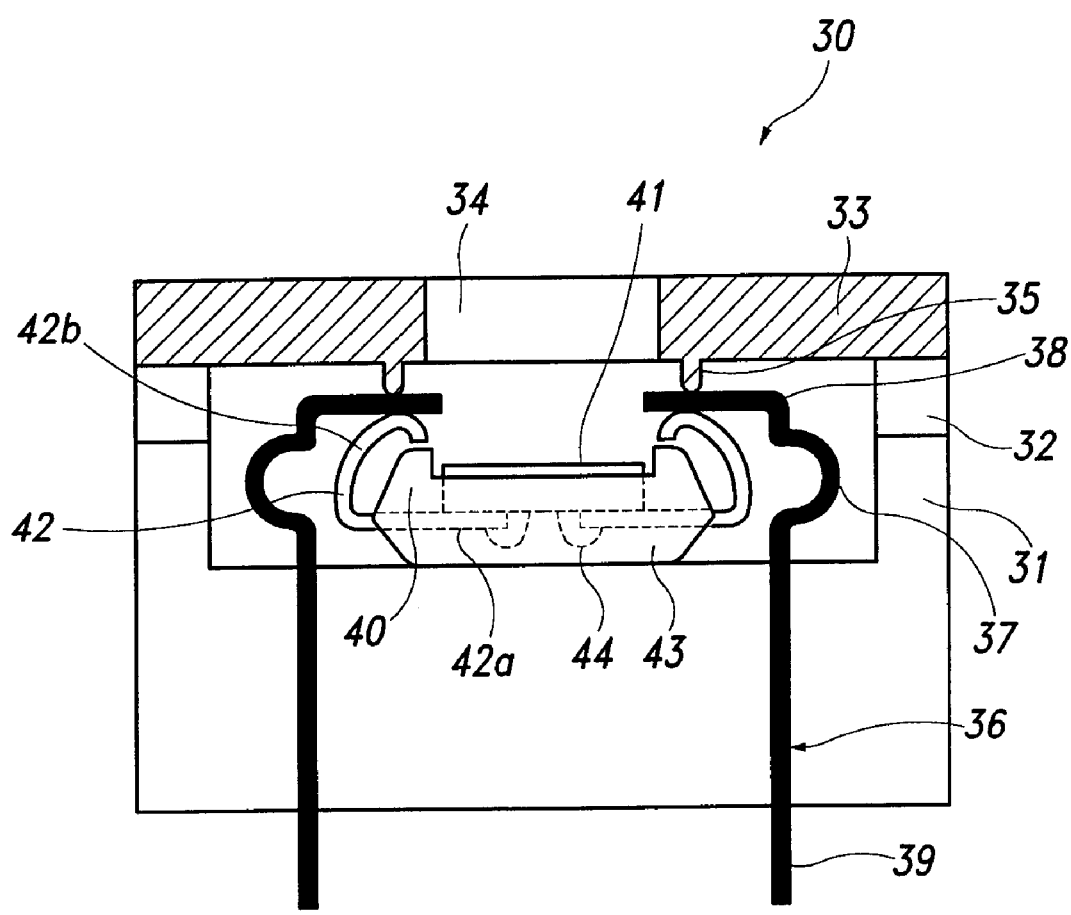
FIG. 3 is a cross-sectional view of another embodiment of a testing module according to the present invention.

Similar reference numerals identifying the structural components in FIG. 3 have been previously described with regard to the embodiment of FIG. 1, and for the sake of brevity are not repeated here.

The test fixture of the testing module 30 shown in FIG. 3 is applicable to not only PLCC (Plastic Leaded Chip Carrier) or SOJ (Small Outline J-leaded) packages, but to pin insert types of packages as well, such as DIPs (Dual In-line Packages).

As mentioned above, the cover of the test fixture of the present invention is connected to the fixture body but can be separated from the fixture body so that the semiconductor device package may be inserted in the text fixture. To this end, the cover can be completely separable from the fixture body, as shown in FIG. 4 or can be secured to the fixture body by a hinge as shown in FIG. 5.

Figure 4:
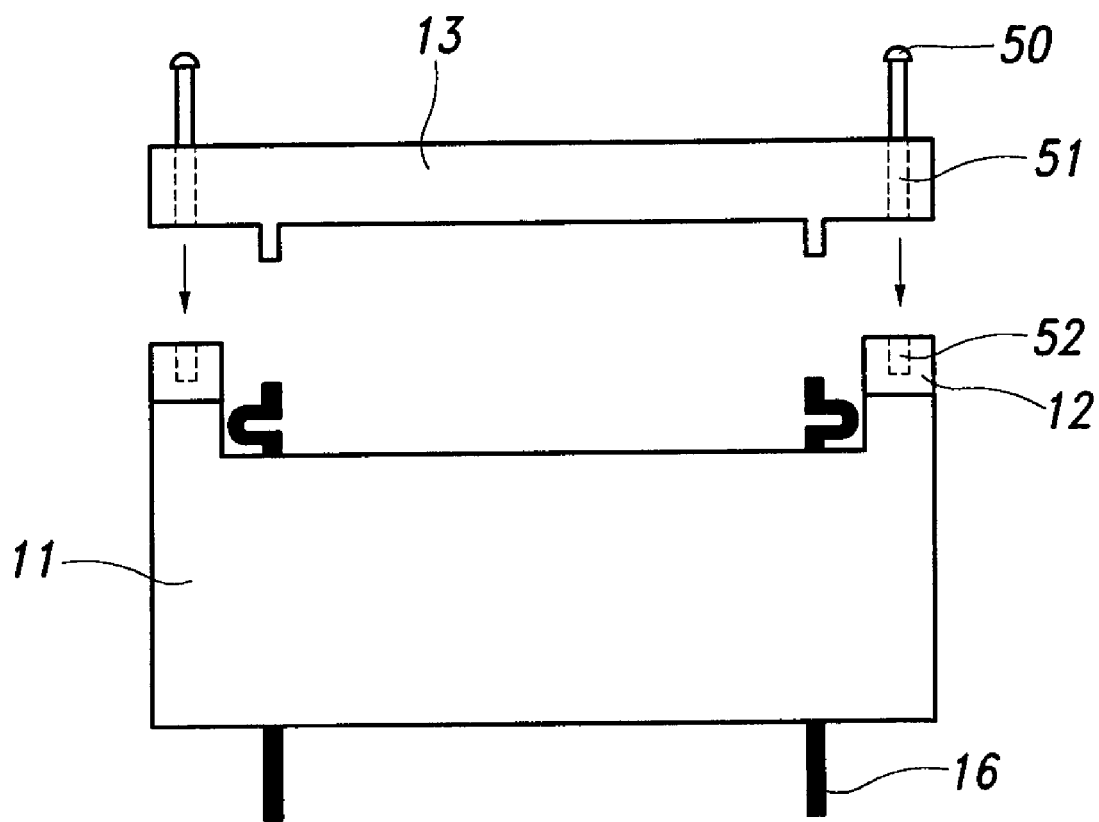
FIG. 4 is a side view of a test fixture according to the present invention, showing one form of a connector for connecting the cover to the body of the fixture.

Referring to FIG. 4, the cover 13 is connected to the fixture body 11 by connection means such as bolts 50 and first and second bolt holes 51, 52. The first bolt holes 51 are formed in the cover 13 while the second bolt holes 52 are formed in the connecting part 12 in alignment with the first bolt holes 51. The cover 13 is closed over the fixture body 11 by inserting the bolts 50 through the first bolt holes 51 and threading them to the second bolt holes 52.

Figure 5:
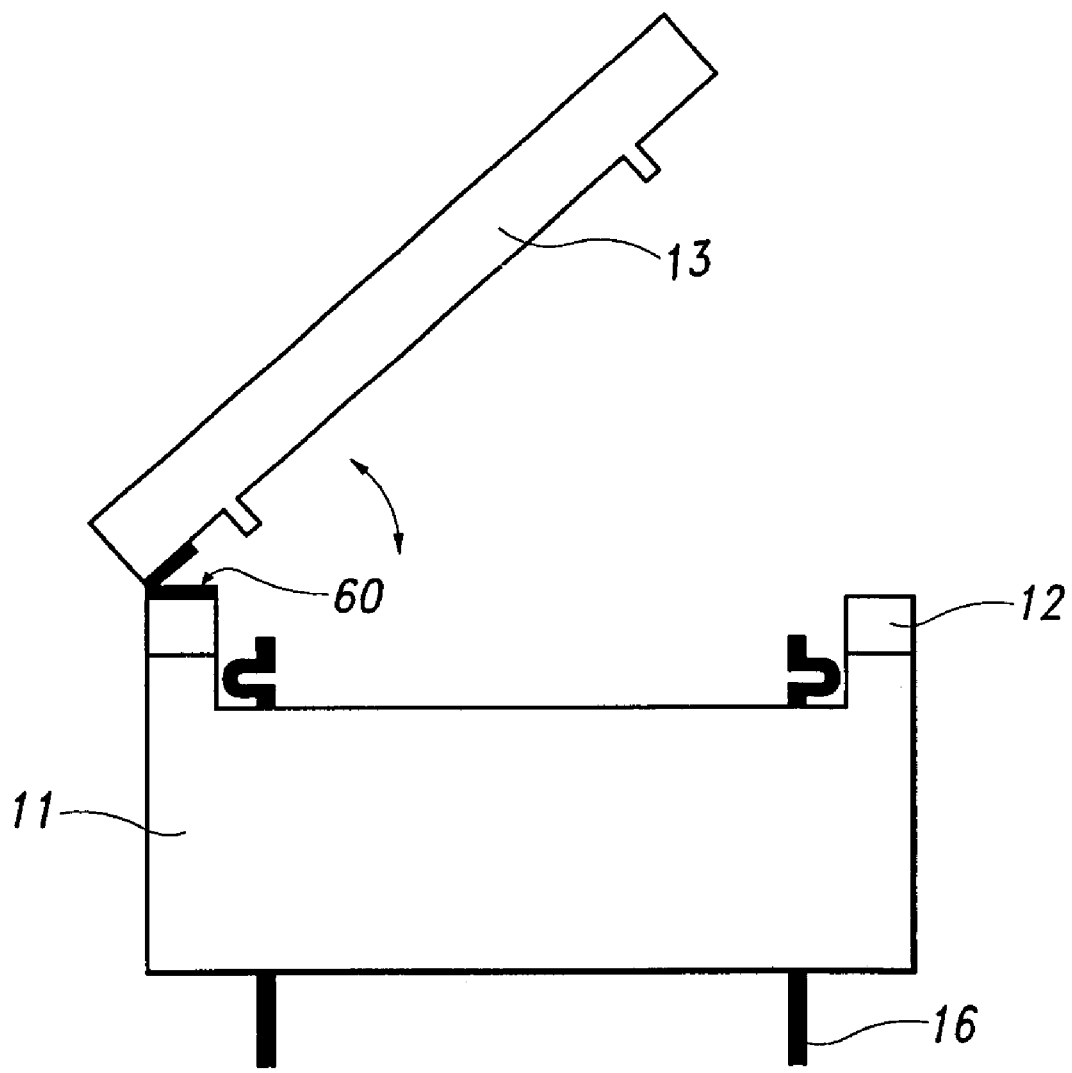
FIG. 5 is a side view of another embodiment of a test fixture according to the present invention.

Referring to FIG. 5, the connection means is a hinge 60. The cover 13 is pivotable about the fixture body 11 as indicated by the arrows. Thus, like the above-described embodiment, the cover 13 is movable between an open position, at which the semiconductor device package can be mounted to the fixture, and a closed position, at which the leads of the package are sandwiched between the pins 16 and the projections of the cover 13. With the cover closed, the back of the package is exposed through the cover opening.

Figure 6:
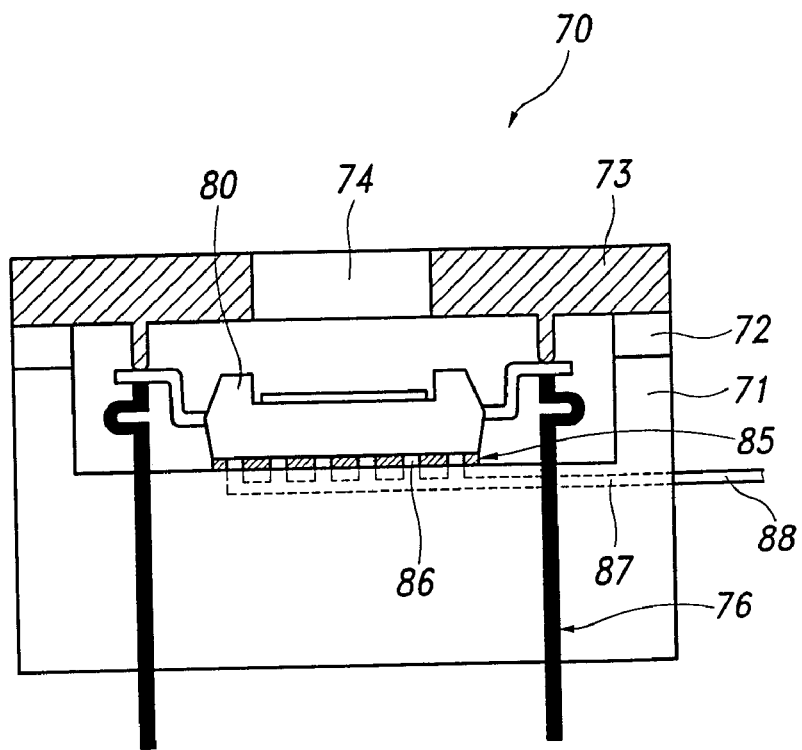
FIG. 6 is a cross-sectional view of another embodiment of a testing module according to the present invention.

FIG. 6 shows another embodiment of the present invention. A test fixture 70 comprises a fixture body 71, a connecting part 72, a cover 73, and connection pins 76, like the test fixtures of the previous embodiments. A cover opening 74 is formed in the cover 73 so as to expose the decapsulated backside of a semiconductor device package 80.

The fixture body 71 has a loading surface on which the semiconductor device package 80 is supported. The loading surface of this embodiment does not have a shape complementary to that of the front portion of the package body. Instead, a resilient member 85 such as a rubber pad forms the loading surface. A plurality of holes 86 are formed in the resilient member 85, and are connected to each other via a vacuum hole 87 which passes through the fixture body 71. The vacuum hole 87 is connected to a vacuum tube 88 which protrudes from the fixture body 71. A vacuum is induced between the semiconductor device package 80 and the fixture body 71 through the holes 86 in the resilient member 85 and the vacuum hole 87. The semiconductor device package 80 is fixed to the test fixture 70 by the vacuum.

Figure 7:
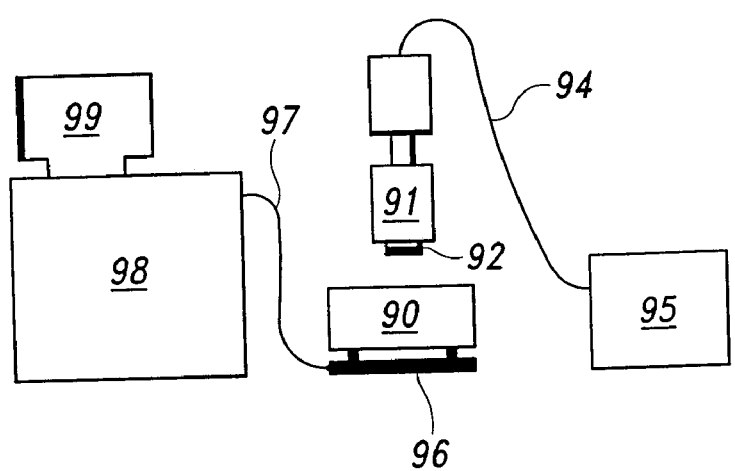
FIG. 7 is a schematic diagram of a system for performing a back side failure analysis of a semiconductor chip supported by a test fixture, i.e., using a testing module, according to the present invention.

FIG. 7 is a schematic diagram of a test system used for conducting a backside failure analysis using the present invention. Referring to this figure, a testing module 90 comprises a semiconductor device package fixed to a test fixture as described in any of the foregoing embodiments. Accordingly, the back of the semiconductor chip is exposed, i.e., the backside of the semiconductor device package is decapsulated, and the semiconductor device package is electrically connected to a test board 96 by the connection pins. The test board 96 is connected by cables 97 to a test apparatus 98. The test apparatus 98 provides power and address signals to the semiconductor chip under commands from a controller 99 which has a micro-processor.

Heat generated by the semiconductor chip is detected by a lens 92 of an optical microscope and an infrared camera 91. More specifically, the heat which is emitted from failed circuits penetrates the silicon substrate of the chip and is conducted to the back of the semiconductor chip. The heat radiates from the back of the chip as infrared rays. The infrared rays emanate from a location corresponding to the area where a failure occurred, are magnified by the lens 92 and are received by the infrared camera 91. The infrared camera transfers an image of the infrared light to an analyzer 95 via cables 94. The failure analyzer 95 has a display, such as a monitor, on which the area where a failure occurred is displayed. If images of the circuit patterns are not displayed clearly during the test, the fixture body of the test fixture is heated to obtain clear and fine images of the circuit patterns. The test apparatus is capable of heating the test fixture in a range of 30 to 80° C.

Because infrared light emitted from the circuit patterns can penetrate the silicon substrate of the semiconductor chip, it is possible to collect the light from the back of the semiconductor chip. Accordingly, an infrared camera is used to detect the area where a failure of the semiconductor chip occurs. In the back side failure analysis using the Emission Microscopy (EMS) technique, the degree to which the silicon substrate absorbs the photons, the thickness of the substrate, the dopant concentration of the substrate, and the frequency response of the emission microscope need to be considered. Such considerations are readily ascertained by one of ordinary skill in the art without undue experimentation.

Although preferred embodiments of the present invention have been described in detail hereinabove, many variations and/or modifications of the basic inventive concepts taught herein will become apparent to those skilled in the art. All such variations and/or modifications are seen to fall within the spirit and scope of the present invention as defined by the appended claims.

What is claimed is:

1. A testing module comprising:
   a semiconductor device package including a semiconductor chip having an active front surface, integrated circuits at the active front surface, and a back opposed to the active front surface, a plurality of leads electrically connected to said semiconductor chip, and a package body having a backside which is decapsulated so as to expose the back of said semiconductor chip, and a front which is opposed to said backside; and
   a test fixture to which said semiconductor device package is mounted, said test fixture comprising
   a fixture body having a loading surface which contacts the front of said package body and supports said semiconductor device package,
   a plurality of connection pins having respective inner ends which are mechanically contacted with and electrically connected to the leads of said semiconductor device package, and respective outer ends integral with the inner ends, the outer ends protruding from said fixture body so as to be connectable to an external apparatus, a cover which has an opening therethrough through which the back of said semiconductor chip is exposed, and a plurality of projections providing the mechanical contact between the leads of said semiconductor device package and the connection pins, and connection means for connecting said cover to said fixture body, so that the projections of said cover provide the mechanical contact between the leads of said semiconductor device package and the connection pins when said cover is at a closed position.

2. The testing module as claimed in claim 1, wherein said loading surface is a concave surface having a shape complementary to that of the front of said package body of said semiconductor device package.

3. The testing module as claimed in claim 1, wherein said fixture body has a plurality of vacuum holes in said loading surface, said vacuum holes being in open communication with an exterior of said fixture body, whereby said semiconductor device package is fixable to said loading surface by evacuating air in said vacuum holes.

4. The testing module as claimed in claim 1, wherein the leads of said semiconductor device package have outer ends which protrude from said package body and which have a gull wing shape, the outer ends of the leads being engaged by and sandwiched between the projections of said cover and the inner ends of the connection pins.

5. The testing module as claimed in claim 1, wherein the leads of said semiconductor device package have outer ends which protrude from said package body and which are J-shaped, and the inner ends of the connection pins are engaged by and sandwiched between the projections of said cover and the outer ends of said leads.

6. The testing module as claimed in claim 1, wherein the outer ends of the connection pins protrude from said test fixture at an end of said test fixture that is opposite an end of said test fixture where the opening in said cover is located, when said cover is in the closed position.

7. The testing module as claimed in claim 1, wherein the opening has an area larger than that of the back of the semiconductor chip left exposed through said package body.

8. The testing module as claimed in claim 1, wherein the inner ends of the connection pins comprise resilient buffer parts that reduce contact resistant between the outer ends of the leads and the inner ends of the connection pins.

9. The testing module as claimed in claim 1, wherein said fixture body and said cover are electrically insulative materials.

10. The testing module as claimed in claim 1, wherein said fixture body is a thermally conductive material.

11. The testing module as claimed in claim 1, wherein the leads have inner ends which are encapsulated by said package body, and the inner ends of the leads are electrically connected to the active front surface of said semiconductor chip.

12. The testing module as claimed in claim 1, wherein said fixture body further comprises a resilient member forming said loading surface.

13. The testing module as claimed in claim 12, wherein said fixture body has a plurality of vacuum holes in said resilient member, said vacuum holes being in open communication with an exterior of said fixture body, whereby said semiconductor device package is fixable to said loading surface by evacuating air in said vacuum holes.

14. A test fixture for use in testing a semiconductor device package for failures in a chip of the semiconductor device package, the test fixture comprising:

a fixture body having a loading surface which supports the semiconductor device package, the semiconductor device package having a back surface that is decapsulated to expose the chip;

a plurality of connection pins having respective inner ends which are mechanically contactable with and electrically connectable to leads of the semiconductor device package, and respective outer ends integral with the inner ends, the outer ends protruding from said fixture body so as to be connectable to an external apparatus, a cover which has an opening therethrough located over the loading surface of said fixture body to expose the decapsulated back surface of the semiconductor device package, and a plurality of projections located around said opening, said plurality of projections allowing mechanical contact between the leads of the semiconductor device package and the connection pins to be realized; and connection means for connecting said cover to said fixture body, so that the projections of said cover provide the mechanical contact between the leads of the semiconductor device package and the connection pins when said cover is at a closed position, the projections of said cover extending into the test fixture to a plane that is above the semiconductor device package, when said cover is at the closed position.

15. The test fixture as claimed in claim 14, wherein said loading surface is a concave surface having a shape complementary to that of a portion of a package body of the semiconductor device package.

16. The test fixture as claimed in claim 14, wherein said fixture body has a plurality of vacuum holes in said loading surface, said vacuum holes being in open communication with an exterior of said fixture body, whereby a vacuum is created at said loading surface by evacuating air in said vacuum holes.

17. The test fixture as claimed in claim 14, wherein the outer ends of the connection pins protrude from the test fixture at an end of the test fixture that is opposite an end of the test fixture where the opening in said cover is located, when said cover is in the closed position.

18. The test fixture as claimed in claim 14, wherein the inner ends of the connection pins comprise buffer parts which are resilient in a direction in which said cover is moved from an open position to the closed position.

19. The test fixture as claimed in claim 14, wherein said fixture body and said cover are electrically insulative materials.

20. The test fixture as claimed in claim 14, wherein said fixture body is a thermally conductive material.

21. The test fixture as claimed in claim 14, wherein said fixture body further comprises a resilient member forming said loading surface.

22. The test fixture as claimed in claim 21, wherein said fixture body has a plurality of vacuum holes in said resilient member, said vacuum holes being in open communication with an exterior of said fixture body, whereby a vacuum is created at said loading surface by evacuating air in said vacuum holes.

* * * * *